(12) United States Patent
Wei et al.

(10) Patent No.: US 11,196,454 B2
(45) Date of Patent: Dec. 7, 2021

(54) DIGITAL TRANSCEIVER DRIVEN BY SYNCHRONOUS SPREAD SPECTRUM CLOCK SIGNAL FOR DATA TRANSMISSION

(71) Applicants: Beijing BOE Technology Development Co., Ltd., Beijing (CN); BOE Technology Group Co., Ltd., Beijing (CN)

(72) Inventors: Xiangye Wei, Beijing (CN); Liming Xiu, Beijing (CN); Yuhai Ma, Beijing (CN); Xin Li, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/975,261

(22) PCT Filed: Oct. 9, 2019

(86) PCT No.: PCT/CN2019/110162
§ 371 (c)(1),
(2) Date: Aug. 24, 2020

(87) PCT Pub. No.: WO2021/068133
PCT Pub. Date: Apr. 15, 2021

(65) Prior Publication Data
US 2021/0111751 A1 Apr. 15, 2021

(51) Int. Cl.
*H04L 7/04* (2006.01)
*H04B 1/7073* (2011.01)
(Continued)

(52) U.S. Cl.
CPC ............. *H04B 1/7073* (2013.01); *G06F 1/08* (2013.01); *G06F 1/12* (2013.01); *H03K 3/037* (2013.01);
(Continued)

(58) Field of Classification Search
CPC ........ H04B 1/7073; H04B 1/40; H03K 3/037; H03K 19/20; H03K 3/84; H04L 7/04; H04L 7/0008; G06F 1/08; G06F 1/12
See application file for complete search history.

(56) References Cited

U.S. PATENT DOCUMENTS 6,160,861 A * 12/2000 McCollough .......... H03C 3/095
332/128
2007/0257718 A1* 11/2007 Ruuswik ................ H04B 15/04
327/156

(Continued)

*Primary Examiner* — Kenneth T Lam
(74) *Attorney, Agent, or Firm* — Intellectual Valley Law, P.C.

(57) ABSTRACT

A digital transceiver is provided. The digital transceiver includes a clock generator configured to generate a first clock signal having a first frequency of a fixed value and a transmitter driven by the first clock signal of the first frequency to transmit data. Additionally, the digital transceiver includes an inverter coupled to the clock generator to generate an inverted first clock signal of the first frequency. Further, it includes a frequency detector configured to compare the first frequency with a second frequency of a feedback signal in a loop of feedback to determine a frequency control word F. Furthermore, it includes a digitally-controlled oscillator driven by the frequency control word F in the loop of feedback to output a second clock signal with a time-average frequency substantially synchronous to the first frequency with a boundary spread and a receiver driven by the second clock signal to receive the data.

20 Claims, 7 Drawing Sheets

(51) Int. Cl.
  *H03K 3/037* (2006.01)
  *H04B 1/40* (2015.01)
  *G06F 1/08* (2006.01)
  *G06F 1/12* (2006.01)
  *H04L 7/00* (2006.01)
  *H03K 19/20* (2006.01)

(52) U.S. Cl.
  CPC ............ *H04B 1/40* (2013.01); *H04L 7/0008* (2013.01); *H04L 7/04* (2013.01); *H03K 19/20* (2013.01)

(56) References Cited

U.S. PATENT DOCUMENTS

| | | | |
|---|---|---|---|
| 2011/0103427 A1* | 5/2011 | Bafra | H03L 7/197 375/130 |
| 2011/0131439 A1* | 6/2011 | Renner | G06F 1/08 713/401 |

* cited by examiner

DIGITAL TRANSCEIVER DRIVEN BY SYNCHRONOUS SPREAD SPECTRUM CLOCK SIGNAL FOR DATA TRANSMISSION

CROSS-REFERENCE TO RELATED APPLICATION

This application is a national stage application under 35 U.S.C. § 371 of International Application No. PCT/CN2019/110162, filed Oct. 9, 2019, the contents of which are incorporated by reference in the entirety.

TECHNICAL FIELD

The present invention relates to data transmission technology, more particularly, to a digital transceiver driven by synchronous spread spectrum clock signal for data transmission.

BACKGROUND

Electromagnetic interference (EMI) issue becomes more and more serious as the development of many kinds of high-frequency electronic products and digital devices. One important anti-EMI technique in use is based on spread spectrum clock signal generator. However, for applications of high-rate data transmission, conventional spread spectrum implementation needs rigorous circuit design encountering many problems such as clock domain signal crossing, data alignment, and setup/hold check issues. As the conventional spread spectrum clock signal is applied for driving data transmission, the data signal phase relationship in the time domain becomes un-controllable, leading to unsecured data transmission. For this reason, on the one hand, typical high-data-rate transceiver based on RAM and FIFO transmission scheme cannot be driven by the spread spectrum clock signal. On the other hand, these transceivers are designed to work under ultra-high (>100 MHz) frequency, resulting in strong EMI. Using external shielding is one way to reduce the EMI of these electronic products, but is undesired due to addition of weight of the product and high cost. Therefore, improved digital transceiver is desired.

SUMMARY

In an aspect, the present disclosure provides a digital transceiver. The digital transceiver includes a clock generator configured to generate a first clock signal having a first frequency of a fixed value. The digital transceiver further includes a transmitter driven by the first clock signal of the first frequency to transmit data. Additionally, the digital transceiver includes an inverter coupled to the clock generator to generate an inverted first clock signal of the first frequency. The digital transceiver also includes a frequency detector configured to compare the inverted first clock signal of the first frequency with a feedback signal of a second frequency varied in a loop of feedback to determine a frequency control word F including an integer part I plus a faction part r (0<r<1). Furthermore, the digital transceiver includes a digitally-controlled oscillator driven by the frequency control word F in the loop of feedback to output a second clock signal with a time-average frequency substantially synchronous to the first frequency with a boundary spread. Moreover, the digital transceiver includes a receiver driven by the second clock signal to receive the data.

Optionally, the frequency detector includes a fraction controller configured to generate a first control signal in a first timeframe for decreasing the integer part I of the frequency control word F and a second control signal in a second timeframe for increasing the integer part I of the frequency control word F. The first timeframe and the second timeframe are set alternately in time one after another in the loop of feedback.

Optionally, the fraction controller includes a first input port receiving the inverted first clock signal, a second input port receiving the feedback signal, a trigger sub-circuit, and a combined logic sub-circuit. The trigger sub-circuit includes four D-type flip-flops coupled to the first input port via a ½-frequency-divider and to the second input port partially via an inverter and configured to determine whether the first frequency is greater or smaller than the second frequency. The combined logic sub-circuit includes two XOR gates, two inverters, and two AND gates coupled to the trigger sub-circuit to output the first control signal to a first control port in the first timeframe if the first frequency is determined to be greater than the second frequency and output the second control signal to a second control port in the second timeframe if the first frequency is determined to be smaller than the second frequency.

Optionally, the first control signal is to control reducing the integer part I by one in each loop of feedback in the first timeframe and the second control signal is to control increasing the integer part I by one in each loop of feedback in the second timeframe.

Optionally, the digitally-controlled oscillator includes a base time unit $\Delta$ based on which a combination of $N_A$ number of pulses with a first period $T_A=I\cdot\Delta$ in the first timeframe and $N_B$ number of pulses with a second period $T_B=(I+1)\cdot\Delta$ in the second timeframe are generated.

Optionally, the digitally-controlled oscillator includes a direct period synthesizer configured to generate a synthesized signal having a time-average period $T_{TAF}=(1-r)\cdot T_A + r\cdot T_B=(I+r)\cdot\Delta=F\cdot\Delta$, wherein the fraction part r is determined by a ratio of $N_B$ over $(N_A+N_B)$.

Optionally, the direct period synthesizer includes a signal generator for generating K pulses having a same input frequency equal to the first frequency and equally spaced phase shift $\Delta$. The direct period synthesizer also includes a first K-to-1 multiplexer coupled to an accumulation-register controlled by the frequency control word F via an accumulator to input the K pulses through a lower path for generating a low level of the synthesized signal. The direct period synthesizer further includes a second K-to-1 multiplexer coupled to an adder-register controlled by a half control word F/2 via an adder to input the K pulses through an upper path for generating a high level of the synthesized signal.

Optionally, the direct period synthesizer further includes a 2-to-1 multiplexer to control transition between the upper path and the lower path to output the synthesized signal with an output frequency $f_2$ that tracks the input frequency $f_1$ of the K pulses as a time-averaged frequency associated with the time-averaged period $T_{TAF}$ via a relationship of $f_2=1/T_{TAF}=K\cdot f_1/F$ with the boundary spread determined by the frequency control word F.

Optionally, the boundary spread includes a maximum phase shift of the output frequency $f_2$ ahead of the input frequency $f_1$, giving by $N_A(T_{TAF}-T_A)$, and a maximum phase shift of the output frequency $f_2$ behind the input frequency $f_1$, giving by $N_B(T_B-T_{TAF})$.

Optionally, the signal generator is a clock generator based on Crystal Oscillator (XO), Voltage Controlled Crystal Oscillator (VCXO), Temperature Compensated Crystal Oscillators (TCXO), Voltage-Controlled Temperature Compensated Crystal Oscillators (VCTCXO), and Oven Controlled Crystal Oscillator (OCXO).

Optionally, the direct period synthesizer further includes a toggle flip-flop coupled to the 2-to-1 multiplexer to toggle the transition of the upper path and the lower path to selectively output the synthesized signal after reaching a dynamic equilibrium of the loop of feedback with the frequency control word F being switched between I and I+1.

Optionally, the synthesized signal is outputted as the second clock signal substantially synchronized with the first frequency of the inverted first clock signal within the boundary spread of the time-average frequency to drive the receiver.

Optionally, the receiver is configured to receive the data transmitted from the transmitter with data integrity ensured by a condition that a data-reception establishing time at the receiver is less than a half the time-average period $T_{TAF}$ subtracting a maximum phase shift of the second clock signal leading the inverted first clock signal and a data-reception maintaining time at the receiver is less than a half the time-average period $T_{TAF}$ subtracting a maximum phase shift of the second clock signal lagging behind the inverted first clock signal.

In another aspect, the present disclosure provides a transceiver chip for data transmission driven by synchronized spread-spectrum clock signal, comprising the digital transceiver described herein. The transceiver chip is implemented in a digital integrated circuit as a system on chip (SOC).

In yet another aspect, the present disclosure provides a testing system for testing the digital transceiver described herein. The testing system includes a pseudo random binary sequence (PRBS) generator driven by a first clock signal to generate a random data stored in the digital transceiver. A transmitter of the digital transceiver is driven by the first clock signal to generate transmitted data based on the random data stored in a first memory in the transmitter and a receiver of the digital transceiver is driven by a second clock signal synchronous to the first clock signal with a frequency boundary spread to store received data and store the received data in a second memory in the receiver. A comparer is driven by the first clock signal to compare the received data with the transmitted data to generate an error data. The error data is 0 corresponding to consistency between the received data and the random data originally generated by the PRBS or 1 corresponding to inconsistency between the received data and the random data.

In still another aspect, the present disclosure provides a method for data transmission driven by synchronized spread spectrum clock signal. The method includes a step of generating a first clock signal of a first frequency with a fixed value. The method further includes a step of driving a transmitter with the first clock signal to transmit data. Additionally, the method includes a step of inverting the first clock signal to obtain an inverted first clock signal of the first frequency. The method further includes a step of generating multiple pulses of the first frequency with equally spaced phase delay Δ. Furthermore, the method includes a step of obtaining a synthesized signal with a time-average frequency based on a time-average period $T_{TAF}$ from one of the multiple pulses controlled by a frequency control word F, the synthesized signal being used as a feedback signal in a loop of feedback. The method further includes a step of outputting a second clock signal based on the synthesized signal with the time-average frequency locked to the first frequency and having a boundary spread determined by a fraction r as the frequency control word F is switched between integer I and integer I+1 at a dynamic equilibrium in the loop of feedback. Moreover, the method includes a step of driving a receiver with the second clock signal to receive the data.

Optionally, the step of inverting the first clock signal includes providing extra phase shift benefit for data reception.

Optionally, the step of generating multiple pulses of the first frequency with equally spaced phase delay Δ includes using a clock generator based on Crystal Oscillator (XO), Voltage Controlled Crystal Oscillator (VCXO). Temperature Compensated Crystal Oscillators (TCXO), Voltage-Controlled Temperature Compensated Crystal Oscillators (VCTCXO), and Oven Controlled Crystal Oscillator (OCXO).

Optionally, the step of obtaining a synthesized signal with a time-average frequency includes using a first K-to-1 multiplexer coupled to an accumulation-register controlled by the frequency control word F via an accumulator in a lower path to input K pulses of the first frequency with equally spaced phase delay Δ, generating a low level of the synthesized signal, using a second K-to-1 multiplexer coupled to an adder-register controlled by a half frequency control word F/2 via an adder in a upper path to input the K pulses of the first frequency with equally spaced phase delay Δ, generating a high level of the synthesized signal, and using a 2-to-1 multiplexer to interlock the lower path and the upper path to output either the high level or the low level of the synthesized signal.

Optionally, the step of driving a receiver with the second clock signal includes using the synthesized signal of the time-average frequency with the boundary spread under a condition that a data-reception establishing time at the receiver is less than a half of the time-average period $T_{TAF}$ subtracting a maximum phase shift of the second clock signal leading the inverted first clock signal and a data-reception maintaining time at the receiver is less than a half of the time-average period $T_{TAF}$ subtracting a maximum phase shift of the second clock signal lagging behind the inverted first clock signal.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Conventional spread spectrum clock signal applied for driving data transmission causes the data signal phase relationship uncontrollable in the time domain, leading to unsecured data transmission. For this reason, on the one hand, typical high data rate transceiver based on RAM and FIFO transmission scheme cannot being driven by the spread spectrum clock signal. On the other hand, these data transceivers are designed to work under ultra-high (>100 MHz) data signal frequency, resulting in strong electromagnetic interference (EMI).

Accordingly, the present disclosure provides, inter alia, a novel digital transceiver driven by a synchronous clock signal with boundary spread for high data-rate transmission, and a method thereof that substantially obviate one or more of the problems due to limitations and disadvantages of the related art. In one aspect, the present disclosure provides a digital transceiver according to some embodiments shown below.

Figure 1:
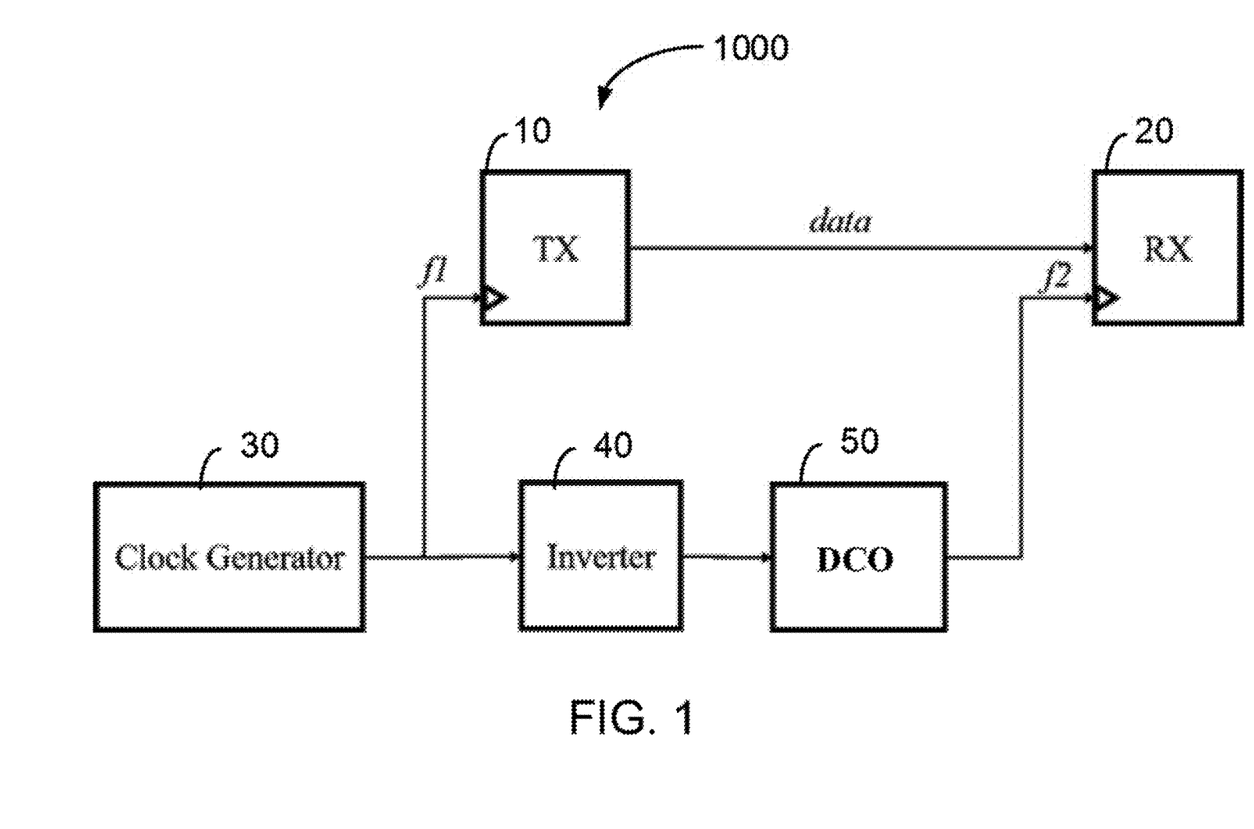
FIG. 1 is a block diagram of a digital transceiver with synchronous spread spectrum for data transmission according to an embodiment of the present disclosure.

FIG. 1 is a block diagram of a digital transceiver with synchronous spread spectrum for data transmission. Referring to FIG. 1, the digital transceiver 1000 includes a transmitter 10 driven by a first clock signal of a first frequency f1 for transmitting data and a receiver 20, driven by a second clock signal of a second frequency f2, for receiving data transmitted from the transmitter 10. In an embodiment, the first clock signal is generated by a clock generator 30. Optionally, the clock generator 30 can be provided with a Crystal Oscillator (XO), Voltage Controlled Crystal Oscillator (VCXO), Temperature Compensated Crystal Oscillators (TCXO), Voltage-Controlled Temperature Compensated Crystal Oscillators (VCTCXO), and Oven Controlled Crystal Oscillator (OCXO). Optionally, the first frequency f1 of the first clock signal has a fixed value. Optionally, the first frequency f1 of the first clock signal is not a signal with spread spectrum. In an embodiment, the second clock signal for driving the receiver 20 is configured to be spread spectrum clock signal with the second frequency f2 substantially synchronous to the first frequency f1 and its signal pulse falling/rising edge being broadened in a boundary range. As long as the boundary range of the second clock signal is properly set to satisfy data establishing and maintaining time in the receiver 20, the receiver 20 driven by the second clock signal can receive the transmitted data correctly without lost data alignment.

Referring to FIG. 1, the digital transceiver 1000 includes a time-average frequency locking loop to generate the synchronous clock signal with boundary spread. In an embodiment, an inverter 40 is coupled to the clock generator 30 to create an inverted first clock signal before feeding it into a digitally-controlled oscillator 50 in a loop of feedback. The digitally-controlled oscillator 50 is configured to generate a synthesized signal based on a principle of time-average frequency direct period synthesis. The synthesized signal is used as a feedback signal in the loop of feedback and eventually outputted as the second clock signal as the loop of feedback reaches an equilibrium state.

Figure 2:
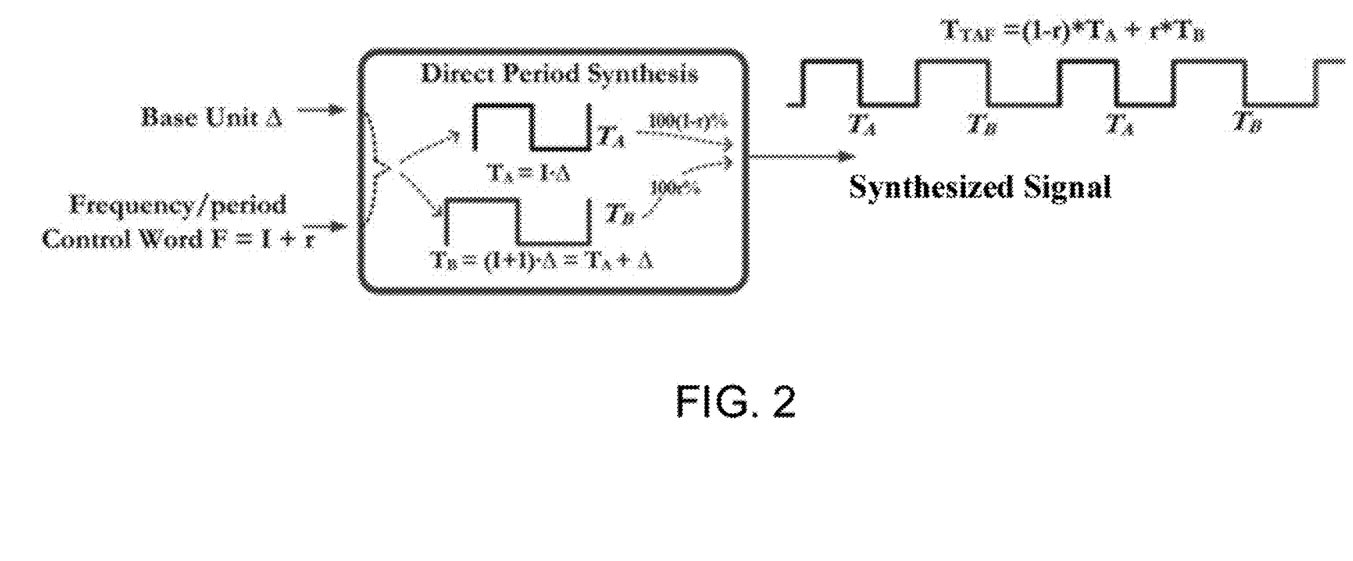
FIG. 2 is a schematic diagram illustrating a generation of a synthesized clock signal based on a base time unit and frequency control word under time-average direct period synthesis according to some embodiments of the present disclosure.

FIG. 2 is a schematic diagram illustrating a generation of a synthesized clock signal based on a base time unit and frequency control word under time-average direct period synthesis according to some embodiments of the present disclosure. Referring to FIG. 2, the frequency locking loop of feedback firstly uses a digital oscillator to generate a base time unit A. Based on the base time unit, two periodic signals with different pulse periods $T_A$ and $T_B$ are respectively generated. A digitally controlled frequency control word F, which at least is represented by its integer part I, is used to set the two pulse periods: $T_A = I \cdot \Delta$, $T_B = (I+1) \cdot \Delta$. The frequency control word F is used to control the digitally-controlled oscillator 50 to synthesize an output signal with pulses in a time-average combination of the two pulse periods $T_A$ and $T_B$. The synthesized signal is provided as a new clock signal with a time-average period $T_{TAF} = (1-r) \cdot T_A + r \cdot T_B = (I+r) \cdot \Delta$. A time-average frequency is $f_{TAF} = 1/T_{TAF}$. Here, r is a fraction number between 0 and 1 representing a possibility of the occurrence of the two types of pulse periods. The frequency control word F=I+r.

Figure 5:
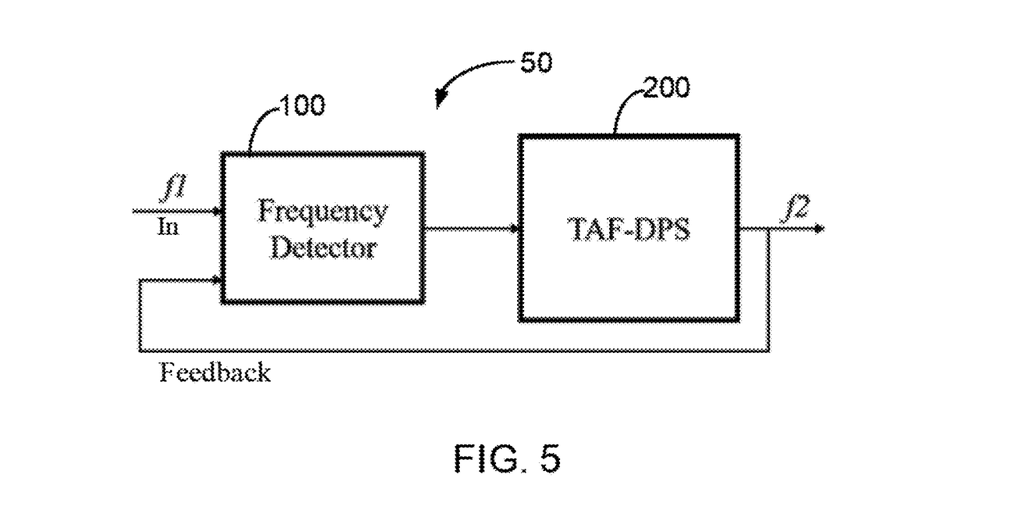
FIG. 5 is a functional diagram of a loop of feedback based on time-average frequency locking according to an embodiment of the present disclosure.

The digitally-controlled oscillator 50 shown in FIG. 1 above includes a frequency detector 100 to compare a first frequency of an input signal and a feedback frequency of a feedback signal in the loop of feedback and a time-average frequency direct period synthesizer 200 to generate a synthesized signal used again as the feedback signal, as shown in FIG. 5. The loop of feedback eventually allows the feedback frequency of the feedback signal to track the first frequency of the input signal.

Figure 6:
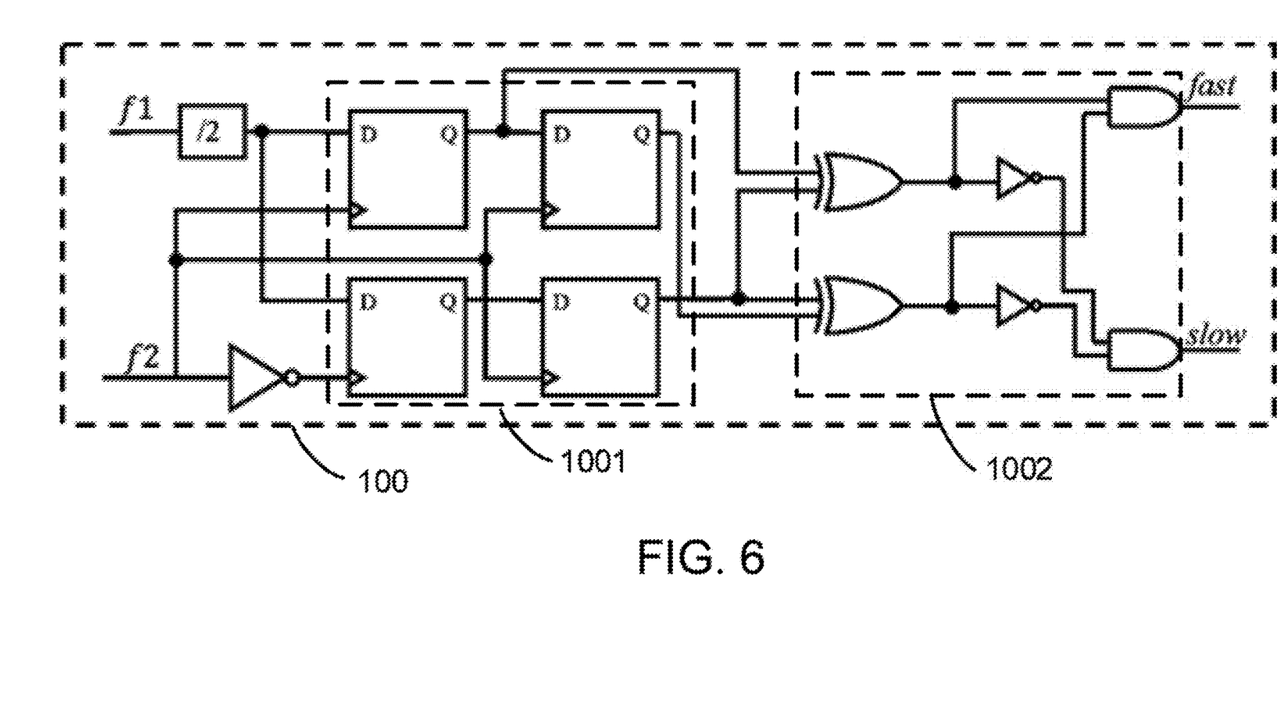
FIG. 6 is a schematic diagram of a logic circuit of the frequency detector in the loop of feedback of FIG. 5 according to an embodiment of the present disclosure.

In a specific embodiment, the frequency detector 100 is configured to compare the input signal of the first frequency f1 with the feedback signal of the second frequency f2 to generate a first control signal fast and a second control signal slow alternately for determining the frequency control word F in the loop of feedback to enable a tracking of the second frequency f2 to the first frequency f1. FIG. 6 shows a schematic diagram of a logic circuit of the frequency detector in the loop of feedback of FIG. 5 according to an embodiment of the present disclosure. Referring to FIG. 6, the frequency detector 100 includes a first input port receiving the input signal, and a second input port receiving the feedback signal. Additionally, the frequency detector 100 includes a trigger sub-circuit 1001 coupled to the first input port and the second input port and configured to detect a relationship between the first frequency f1 and the second frequency f2. The frequency detector 100 further includes a combined logic sub-circuit 1002 coupled to the trigger sub-circuit 1001 to generate the first control signal fast to a first control port in a first timeframe and the second control signal slow to a second control port in a second timeframe. The first timeframe and second timeframe alternately appearing one after other.

In an embodiment, the trigger sub-circuit 1001 includes four D-type flip-flops coupled to the first input port via a frequency-divider and to the second input port partially via an inverter. The trigger sub-circuit 1001 is configured to determine whether the first frequency f1 being greater or smaller than the second frequency f2. The combined logic sub-circuit 1002 includes two XOR gates, two inverters, and two AND gates configured to output either the first control signal fast to the first control port in the first timeframe based on determination that the first frequency f1 is greater than the second frequency f2 or the second control signal slow to the second control port in the second timeframe based on determination that the first frequency f1 is smaller than the second frequency f2. In the embodiment, the first control signal fast is driving to reduce the frequency control word F and the second control signal slow is driving to increase the frequency control word F, in the loop of feedback. Eventually, the whole loop of feedback reaches a dynamic equilibrium as the first control signal fast and the second control signal slow are alternately generated and the frequency control word F is switched between two integers I and I+1. In other words, the second frequency is substantially locked to the first frequency within the loop of feedback. When input frequency changes. i.e., the locking target is changed, the frequency detector 100 is operated to determine the frequency control word to accomplish the frequency locking in the loop of feedback.

Figure 3:
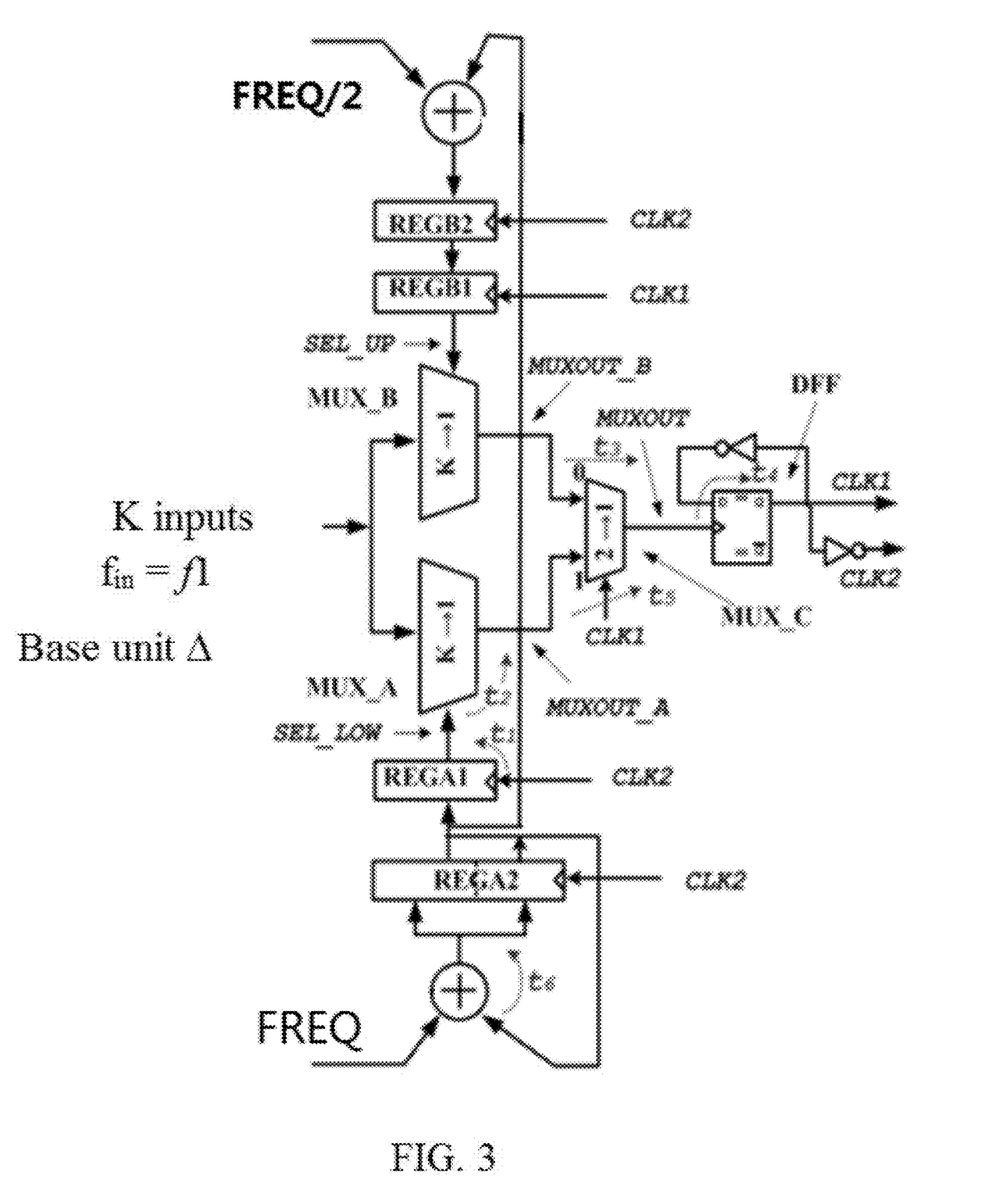
FIG. 3 is a functional diagram of a logic circuit for time-average frequency direct period synthesis according to an embodiment of the present disclosure.
Figure 4:
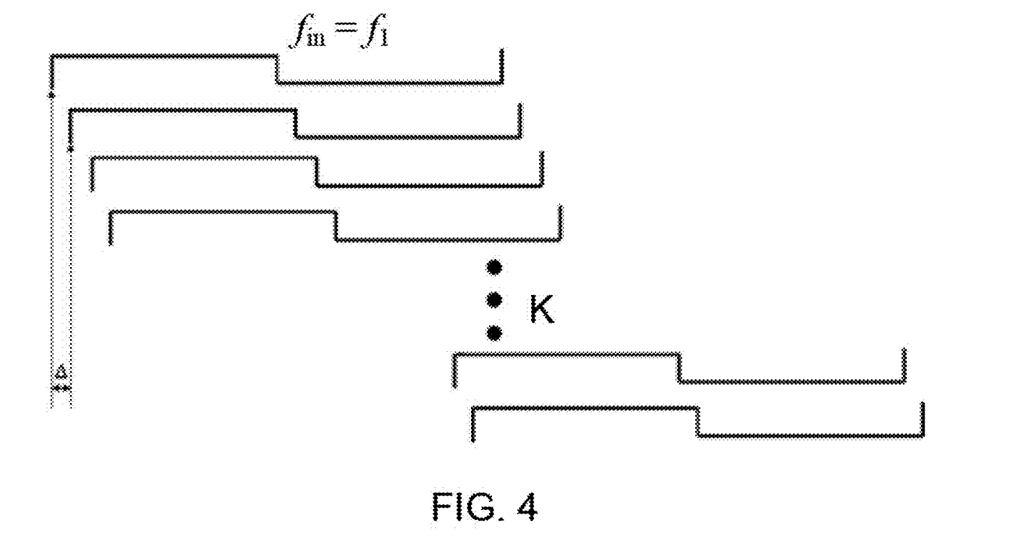
FIG. 4 is a schematic diagram illustrating K input pulses to be loaded in the logic circuit of FIG. 3 with equally spaced phase of a base time unit D according to an embodiment of the present disclosure.

Back to FIG. 5, the frequency detector 100 operates with the time-average frequency direct period synthesizer 200 to accomplish the frequency locking in the loop of feedback. In an embodiment. FIG. 3 shows a functional diagram of a logic circuit for a time-average frequency direct period synthesizer 200 according to an embodiment of the present disclosure. In the embodiment, in each loop, the frequency detector 100 passes the input frequency $f_{in}=f1$ and provides a frequency control word F to the time-average frequency direct period synthesizer 200. Referring to FIG. 3, the K input pulses are generated by a simple voltage-controlled oscillator (VCO) based on the base time unit Δ generated by a crystal oscillator (XO). Optionally, the K input pulses are based on the base time unit Δ which is created from K phase-evenly-spaced signals with a same frequency $f_{in}=f1$. FIG. 4 shows a schematic diagram of K input pulses for the digital controlled oscillator of FIG. 3 according to an embodiment of the present disclosure.

The K input pulses are inputted respectively to two K-to-1 multiplexers. A first K-to-1 multiplexer (MUX_A) at a lower half of the figure is coupled to a 2-pipeline register controlled by the control word F via an accumulator to allow the K input pulses to pass through a lower path as a first output MUXOUT_A.

At a transition time t6, the accumulator performs accumulation computation every rising edge of clock to handle that the frequency control word F which is a real number including the fraction part r and the integer part I. The K-to-1 multiplexer in the lower path dominates the length of logic '0' of output CLK1 at a low voltage level. At a first transition time t1, the SEL_LOW is fed into the first (or lower) K-to-1 multiplexer at a rising edge of CLK2. So, it will choose one pulse of the K pulses to be the first output.

A second K-to-1 multiplexer (MUX_B) coupled to a 2-pipeline register controlled by the half control word F/2 via an adder to input the K pulses through an upper path for generating a high level of a second output MUXOUT_B. The adder only has the integer part I of the frequency control word F. The K-to-1 multiplexer in the upper path dominates the length of logic '1' of output CLK1 at a high voltage level.

Referring to FIG. 3, additionally, a 2-to-1 multiplexer MUX-C is controlled by CLK1 to control the transition of upper path and lower path. Now only one signal, from either upper path or lower path, arrives at a toggle flip-flop circuit which includes a D-type flip-flop and two inverters to toggle the output MUXOUT at every rising edge of clock, from '1' to '0' or from '0' to '1'.

At a second transition time t2, the chosen signal passes the first K-to-1 multiplexer MUX_A and is fed into the 2-to-1 multiplexer MUX-C.

At a third transition time t3, which occurs simultaneously with t2, when CLK2 is at the state of logic '1' after rising edge, the CLK1 is at the state of logic '0'. So, the 2-to-1 multiplexer MUX-C chooses the second output MUXOUT_B from the upper path as MUXOUT sent to the toggle flip-flop.

At a fourth transition time t4, the rising edge of the second output MUXOUT_B arrives at the toggle flip-flop which finishes the transition from 0 to 1.

At a fifth transition time t5, CLK1 now is transited to 1. So the 2-to-1 multiplexer MUX-C chooses the first output MUXOUT_A of the lower path to send to the toggle flip-flop. The whole process repeats itself in the loop of feedback.

In the embodiment, the synthesized signal with the time-average frequency $f_{TAF}=K \cdot f_{in}/F$ is outputted from the digitally-controlled oscillator 50 in each loop of feedback as the frequency control word F varies. Eventually, the loop of feedback reaches a dynamic equilibrium as the frequency control word F determined by the frequency detector 100 is switched between integer I and I+1. This represents that the second frequency f2 in the loop of feedback (see FIG. 5), which is the time-average frequency $f_{TAF}$ synthesized by and outputted from the time-average frequency direct period synthesizer 200, substantially tracks the first frequency or the input frequency f1, in a broadened phase range. The broadened phase range can be expressed as boundary spread in frequency of the synthesized signal out of $N_A$ number of cycles $T_A=I \cdot \Delta$, and $N_B$ number of cycles $T_B=(I+1) \cdot \Delta$ in the first timeframe plus the second timeframe, representing by ($\theta_{max}^-$, $\theta_{max}^+$). $\theta_{max}^-$ represents a maximum phase shift of the second frequency f2 ahead of the input frequency f1, giving by $N_A(T_{TAF}-T_A)$, and $\theta_{max}^+$ represents a maximum phase shift of the second frequency f2 behind the input frequency f1, giving by $N_B(T_B-T_{TAF})$.

Figure 7:
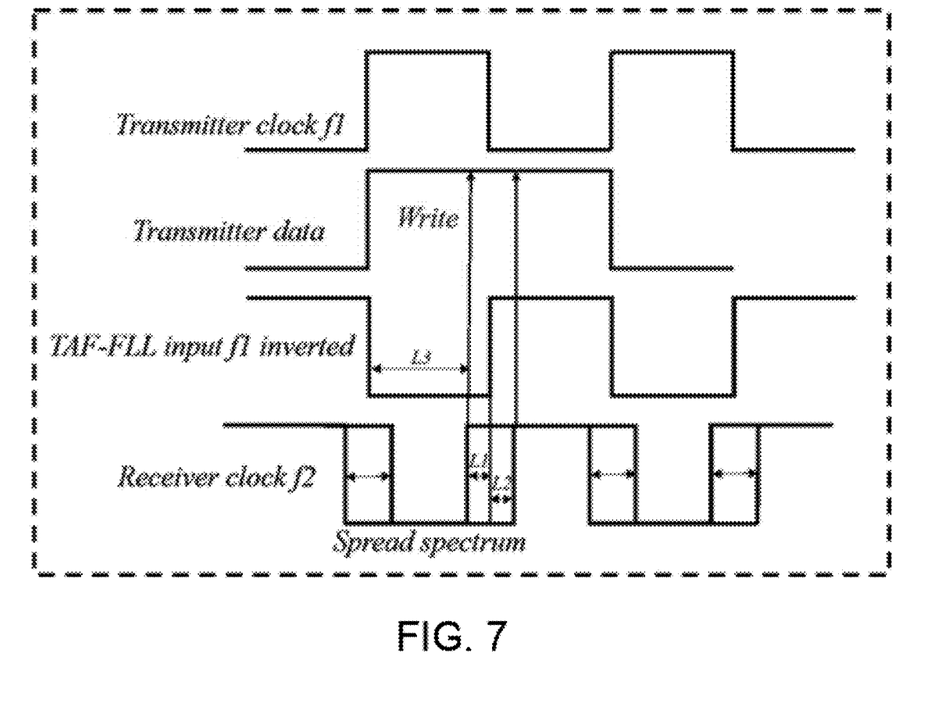
FIG. 7 is a waveform diagram showing phase relationship of multiple signals involved in the digital transceiver according to an embodiment of the present disclosure.

FIG. 7 is a waveform diagram showing phase relationship of multiple signals involved in the digital transceiver 1000 according to an embodiment of the present disclosure. Referring to FIG. 7, in an example, the input signal is square wave with the first frequency f1 at a fixed value, i.e., it is the first clock signal used for driving the transmitter 10 to transmit data. As seen in FIG. 7, the first clock signal has no boundary spread. In each cycle given by the first clock signal, the transmitted data is written to memory of the transmitter 10 and is transmitted out. As shown in FIG. 1, an inverter 40 generates an inverted first clock signal which has a same first frequency yet with an inverted phase. The inverted first clock signal is the input signal with the first frequency loaded into the digitally-controlled oscillator 50. Optionally, the phase inversion performed by the inverter 40 on the first clock signal before loading the inverted first clock signal as an input signal to the digitally-controlled oscillator 50 allows an extra cycle delay for operating the time-average frequency locking loop of feedback. As shown in FIG. 7, the input signal, shown as TAF-FLL input f1 inverted from original Transmitter clock f1, has opposite phase therebetween but a same frequency f1. The output signal (after the loop of feedback reaches the dynamic equilibrium) has a second frequency shown as Receiver clock f2. f2 substantially tracks or is locked to f1, but with a broadened boundary L1+L2. In other words, the output signal is provided as a second clock signal with the second frequency substantially synchronous to the first clock frequency with a boundary spread.

In an embodiment, referring to FIG. 7, a time period between a falling edge of the input signal in one cycle and an earliest rising edge of the output signal in the same one cycle gives a minimum phase shift value of $L3_{min}=T/2-L1=T/2-\theta_{max}^-$. In the same embodiment, a time period between the falling edge of the input signal in one cycle and a latest rising edge of the output signal in the same one cycle gives a maximum phase shift value $L3_{max}=T/2+L2=T/2+\theta_{max}^+$. In order for the receiver 20 to receive data transmitted from the transmitter 10 correctly without loss data alignment and security, the following conditions must be met:

$$T_{SU}<L3_{min}.$$

$$T_H<T-L3_{max}$$

where $T_{SU}$ represents a data establishing time required for the receiver and $T_H$ represents a data maintaining time required for the receiver.

In another aspect, the present disclosure provides a transceiver chip for data transmission driven by synchronized spread-spectrum clock signal, comprising the digital transceiver 1000 described herein and implemented in a digital integrated circuit as a system on chip (SOC). Optionally, the digital transceiver 1000 is implemented in a Field Programmable Gate Array (FPGA) chip device. Optionally, the digital transceiver 1000 is implemented in an application-specific integrated circuit (ASIC) chip device.

Figure 8:
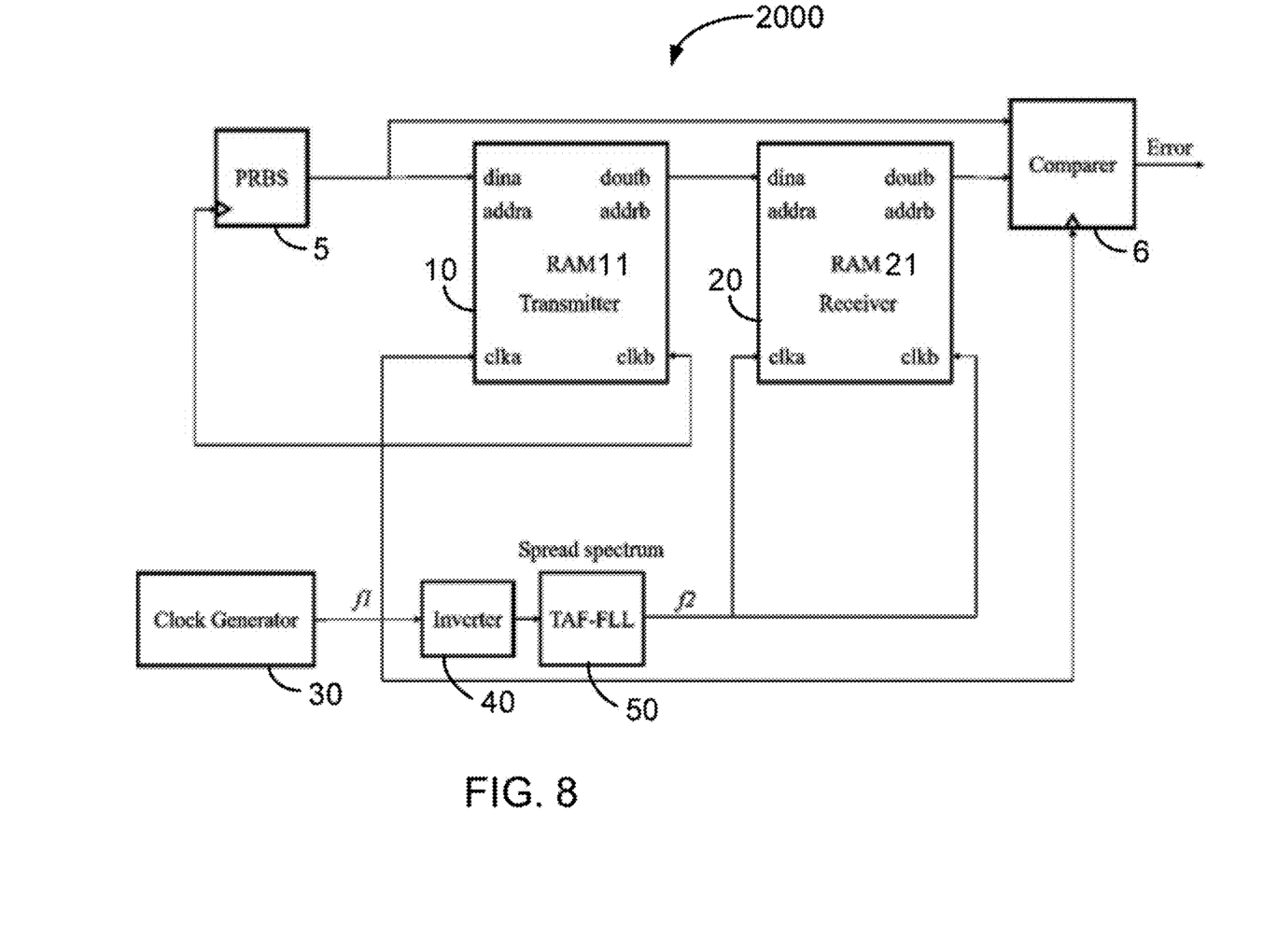
FIG. 8 is a block diagram of a simplified testing system for testing the digital transceiver of FIG. 1 according to an embodiment of the present disclosure.

In yet another aspect, the present disclosure provides a testing system for testing the digital transceiver described herein. FIG. 8 shows a block diagram of a simplified testing system 2000 for testing the digital transceiver 1000 of FIG. 1 according to an embodiment of the present disclosure. Referring to FIG. 8, the testing system 2000 includes a pseudo random binary sequence (PRBS) generator 5 driven by a first clock signal to generate a random data stored in a memory (RAM11) of the transmitter 10 of the digital transceiver 1000. The transmitter 10 driven by the first clock signal of a first frequency f1 generates transmitted data based on the random data generated by PRBS 5. The receiver 20 of the digital transceiver 1000 is driven by a second clock signal with a second frequency f2 synchronous to the first clock signal and having a frequency boundary spread, to collect received data and store the collected data in a memory (RAM21) of the receiver 20. The testing system 2000 further includes a comparer 6 driven also by the first clock signal f1 to compare the received data with the transmitted data to generate an Error data, Optionally, the Error data is 0 corresponding to consistency between the received data and the random data originally generated by the PRBS 5. Optionally, the Error data is 1 corresponding to inconsistency between the received data and the random data. In general, as the digital transceiver 1000 includes a time-average frequency locking loop of feedback to track the first or input frequency of the first clock signal with the second or output frequency of the second clock signal, in earlier time periods during which the loop of feedback is operated in frequency tracking without reaching the dynamic equilibrium yet, part of received data in these earlier time periods have error data 1 being outputted. As the dynamic equilibrium is reached and the digital transceiver 1000 is stabilized, consistency between the input frequency of the first clock signal and the output frequency of the second clock signal can be established, resulting substantially error data of 0 corresponding to full data alignment.

The synchronous spread spectrum clock signal drives the receiver of the digital transceiver system, leading to substantially reduction of electromagnetic interference during the (high-rate) data transmission. As the transmitter and the receiver in the digital transceiver system are respectively driven by different clock signals and individual module in the system is allowed to possess a function of enabling spread spectrum clock signal control, the transceiver system can flexibly use clock signals for driving data transmission and reception. The whole system circuit is simple and high in efficiency with anti-EMI function and can be implemented conveniently in a system-on-chip format in applications for high-rate data transmission.

In still another aspect, the present disclosure provides a method for data transmission driven by synchronized spread spectrum clock signal. The method includes generating a first clock signal of a first frequency with a fixed value. The method also includes driving a transmitter with the first clock signal to transmit data. Additionally, the method includes inverting the first clock signal to obtain an inverted first clock signal of the first frequency. The method further includes generating multiple pulses of the first frequency with equally spaced phase delay $\Delta$. Furthermore, the method includes obtaining a synthesized signal with a time-average frequency based on a time-average period $T_{TAF}$ from one of the multiple pulses controlled by a frequency control word F. The synthesized signal is also used as a feedback signal in a time-average frequency locking loop of feedback. The method further includes outputting a second clock signal based on the synthesized signal with the time-average frequency locked to the first frequency with a boundary spread determined by a fraction r as the frequency control word F is switched between integer I and integer I+1 at a dynamic equilibrium in the loop of feedback. Moreover, the method includes driving a receiver with the second clock signal to receive the data.

In particular, the step of generating multiple pulses of the first frequency with equally spaced phase delay $\Delta$ includes using a clock generator based on Crystal Oscillator (XO), Voltage Controlled Crystal Oscillator (VCXO), Temperature Compensated Crystal Oscillators (TCXO), Voltage-Controlled Temperature Compensated Crystal Oscillators (VCTCXO), and Oven Controlled Crystal Oscillator (OCXO) based on an input signal, i.e., the first clock signal of the first frequency.

In an embodiment, the step of inverting the first clock signal includes providing extra phase shift benefit for data reception.

In an embodiment, the step of obtaining a synthesized signal with a time-average frequency includes using a first K-to-1 multiplexer coupled to an accumulation-register controlled by the frequency control word F via an accumulator in a first path to input K pulses of the first frequency with equally spaced phase delay $\Delta$, generating a low level of the synthesized signal, using a second K-to-1 multiplexer coupled to an adder-register controlled by a half frequency control word F/2 via an adder in a second path to input the K pulses of the first frequency with equally spaced phase delay $\Delta$, generating a high level of the synthesized signal, using a 2-to-1 multiplexer to interlock the first path and the second path to output either the high level or the low level of the synthesized signal.

Finally, the step of driving the receiver with the second clock signal includes using the synthesized signal of the time-average frequency with the boundary spread under a condition that a data-reception establishing time at the receiver is less than a half of the time-average period $T_{TAF}$ subtracting a maximum phase shift of the second clock signal leading the inverted first clock signal and a data-reception maintaining time at the receiver is less than a half of the time-average period $T_{TAF}$ subtracting a maximum phase shift of the second clock signal lagging behind the inverted first clock signal.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A digital transceiver comprising:
a clock generator configured to generate a first clock signal having a first frequency of a fixed value;
a transmitter driven by the first clock signal of the first frequency to transmit data;
an inverter coupled to the clock generator to generate an inverted first clock signal of the first frequency;
a frequency detector configured to compare the inverted first clock signal of the first frequency with a feedback signal of a second frequency varied in a loop of feedback to determine a frequency control word F including an integer part I plus a fraction part r(0<r<1);
a digitally-controlled oscillator driven by the frequency control word F in the loop of feedback to output a second clock signal with a time-average frequency substantially synchronous to the first frequency with a boundary spread; and
a receiver driven by the second clock signal to receive the data.

2. The digital transceiver of claim 1, wherein the frequency detector comprises a fraction controller configured to generate a first control signal in a first timeframe for decreasing the integer part I of the frequency control word F and a second control signal in a second timeframe for increasing the integer part I of the frequency control word F, the first timeframe and the second timeframe being set alternately in time one after another in the loop of feedback.

3. The digital transceiver of claim 2, wherein the fraction controller comprises a first input port receiving the inverted first clock signal, a second input port receiving the feedback signal, a trigger sub-circuit comprising four D-type flip-flops coupled to the first input port via a ½-frequency-divider and to the second input port partially via an inverter and configured to determine the first frequency being greater or smaller than the second frequency, a combined logic sub-circuit comprising two XOR gates, two inverters, and two AND gates coupled to the trigger sub-circuit to output the first control signal to a first control port in the first timeframe if the first frequency is determined to be greater than the second frequency and output the second control signal to a second control port in the second timeframe if the first frequency is determined to be smaller than the second frequency.

4. The digital transceiver of claim 3, wherein the first control signal is to control reducing the integer part I by one in each loop of feedback in the first timeframe and the second control signal is to control increasing the integer part I by one in each loop of feedback in the second timeframe.

5. The digital transceiver of claim 4, wherein the digitally-controlled oscillator comprises a base time unit $\Delta$ based on which a combination of $N_A$ number of pulses with a first period $T_A = I \cdot \Delta$ in the first timeframe and $N_B$ number of pulses with a second period $T_B = (I+1) \cdot \Delta$ in the second timeframe are generated.

6. The digital transceiver of claim 5, wherein the digitally-controlled oscillator comprises a direct period synthesizer configured to generate a synthesized signal having a time-average period $T_{TAF} = (1-r) \cdot T_A + r \cdot T_B = (I+r) \cdot \Delta = F \cdot \Delta$, wherein the fraction part r is determined by a ratio of $N_B$ over $(N_A + N_B)$.

7. The digital transceiver of claim 6, wherein the direct period synthesizer comprises a signal generator for generating K pulses having a same input frequency equal to the first frequency and equally spaced phase shift $\Delta$, a first K-to-1 multiplexer coupled to an accumulation-register controlled by the frequency control word F via an accumulator to input the K pulses through a lower path for generating a low level of the synthesized signal, a second K-to-1 multiplexer coupled to an adder-register controlled by a half control word F/2 via an adder to input the K pulses through an upper path for generating a high level of the synthesized signal.

8. The digital transceiver of claim 7, wherein the direct period synthesizer further comprises a 2-to-1 multiplexer to control transition between the upper path and the lower path to output the synthesized signal with an output frequency $f_2$ that tracks an input frequency $f_1$ of the K pulses as a time-averaged frequency associated with the time-averaged period $T_{TAF}$ via a relationship of $f_2 = 1/T_{TAF} = K \cdot f_1 / F$ with the boundary spread determined by the frequency control word F.

9. The digital transceiver of claim 7, wherein the signal generator is a clock generator based on an oscillator selected from the group consisting of Crystal Oscillator (XO), Voltage Controlled Crystal Oscillator (VCXO), Temperature Compensated Crystal Oscillators (TCXO), Voltage-Controlled Temperature Compensated Crystal Oscillators (VCTCXO), and Oven Controlled Crystal Oscillator (OCXO).

10. The digital transceiver of claim 8, wherein the boundary spread comprises a maximum phase shift of the output frequency $f_2$ ahead of the input frequency $f_1$, giving by $N_A(T_{TAF} - T_A)$, and a maximum phase shift of the output frequency $f_2$ behind the input frequency $f_1$, giving by $N_B(T_B - T_{TAF})$.

11. The digital transceiver of claim 10, wherein the direct period synthesizer further comprises a toggle flip-flop coupled to the 2-to-1 multiplexer to toggle the transition of the upper path and the lower path to selectively output the synthesized signal after reaching a dynamic equilibrium of the loop of feedback with the frequency control word F being switched between I and I+1.

12. The digital transceiver of claim 11, wherein the synthesized signal is outputted as the second clock signal substantially synchronized with the first frequency of the inverted first clock signal within the boundary spread of the time-average frequency to drive the receiver.

13. The digital transceiver of claim 12, wherein the receiver is configured to receive the data transmitted from the transmitter with data integrity ensured by a condition that a data-reception establishing time at the receiver is less than a half the time-average period $T_{TAF}$ subtracting a maximum phase shift of the second clock signal leading the inverted first clock signal and a data-reception maintaining time at the receiver is less than a half the time-average period $T_{TAF}$ subtracting a maximum phase shift of the second clock signal lagging behind the inverted first clock signal.

14. A transceiver chip for data transmission driven by synchronized spread-spectrum clock signal, comprising the digital transceiver of claim 1 implemented in a digital integrated circuit as a system on chip (SOC).

15. A testing system for testing the digital transceiver of claim 1, comprising: a pseudo random binary sequence (PRBS) generator driven by the first clock signal to generate a random data stored in the digital transceiver, wherein a transmitter of the digital transceiver is driven by the first clock signal to generate transmitted data based on the random data stored in a first memory in the transmitter and a receiver of the digital transceiver is driven by a second clock signal synchronous to the first clock signal with a frequency boundary spread to store received data and store the received data in a second memory in the receiver; and a comparer driven by the first clock signal to compare the received data with the transmitted data to generate an error data, wherein the error data is 0 corresponding to consistency between the received data and the random data originally generated by the PRBS or 1 corresponding to inconsistency between the received data and the random data.

16. A method for data transmission driven by synchronized spread spectrum clock signal, comprising:
generating a first clock signal of a first frequency with a fixed value;
driving a transmitter with the first clock signal to transmit data;
inverting the first clock signal to obtain an inverted first clock signal of the first frequency;
generating multiple pulses of the first frequency with equally spaced phase delay $\Delta$;
obtaining a synthesized signal with a time-average frequency based on a time-average period $T_{TAF}$ from one of the multiple pulses controlled by a frequency control word F, the synthesized signal being used as a feedback signal in a loop of feedback;
outputting a second clock signal based on the synthesized signal with the time-average frequency locked to the first frequency and having a boundary spread determined by a fraction r as the frequency control word F is switched between integer I and integer I+1 at a dynamic equilibrium in the loop of feedback; and
driving a receiver with the second clock signal to receive the data.

17. The method of claim 16, wherein inverting the first clock signal comprises providing extra phase shift benefit for data reception.

18. The method of claim 16, wherein generating multiple pulses of the first frequency with equally spaced phase delay $\Delta$ comprises using a clock generator based on an oscillator selected from the group consisting of Crystal Oscillator (XO), Voltage Controlled Crystal Oscillator (VCXO), Temperature Compensated Crystal Oscillators (TCXO), Voltage-Controlled Temperature Compensated Crystal Oscillators (VCTCXO), and Oven Controlled Crystal Oscillator (OCXO).

19. The method of claim 18, wherein obtaining a synthesized signal with a time-average frequency comprises using a first K-to-1 multiplexer coupled to an accumulation-register controlled by the frequency control word F via an accumulator in a first path to input K pulses of the first frequency with equally spaced phase delay $\Delta$, generating a low level of the synthesized signal, using a second K-to-1 multiplexer coupled to an adder-register controlled by a half frequency control word F/2 via an adder in a second path to input the K pulses of the first frequency with equally spaced phase delay $\Delta$, generating a high level of the synthesized signal, and using a 2-to-1 multiplexer to interlock the first path and the second path to output either the high level or the low level of the synthesized signal.

20. The method of claim 16, wherein driving a receiver with the second clock signal comprises using the synthesized signal of the time-average frequency with the boundary spread under a condition that a data-reception establishing time at the receiver is less than a half of the time-average period $T_{TAF}$ subtracting a maximum phase shift of the second clock signal leading the inverted first clock signal and a data-reception maintaining time at the receiver is less than a half of the time-average period $T_{TAF}$ subtracting a maximum phase shift of the second clock signal lagging behind the inverted first clock signal.

* * * * *